United States Patent
Swartz et al.

(12)

(10) Patent No.: US 6,819,145 B2
(45) Date of Patent: Nov. 16, 2004

(54) HIGH SPEED DIFFERENTIAL PRE-DRIVER USING COMMON MODE PRE-CHARGE

(75) Inventors: Ronald W. Swartz, Orangevale, CA (US); Yoon San Ho, Gelugor (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/186,638

(22) Filed: Jun. 28, 2002

(65) Prior Publication Data

US 2004/0000680 A1 Jan. 1, 2004

(51) Int. Cl.[7] ............................ H03K 5/22; H03K 5/153
(52) U.S. Cl. ........................ 327/65; 327/79; 327/331; 327/333
(58) Field of Search ............................ 327/65, 78, 79, 327/108, 331, 333, 389

(56) References Cited

U.S. PATENT DOCUMENTS

| | | | |
|---|---|---|---|
| 5,717,557 A | | 2/1998 | Gonzalez et al. |
| 5,898,297 A | * | 4/1999 | Bosnyak et al. ............. 323/315 |
| 5,920,204 A | | 7/1999 | Bruno |
| 5,959,492 A | * | 9/1999 | Khoury et al. ............... 327/389 |
| 5,999,044 A | * | 12/1999 | Wohlfarth et al. ........... 327/563 |
| 2001/0024137 A1 | * | 9/2001 | Miura ......................... 327/333 |
| 2002/0041633 A1 | | 4/2002 | Cho et al. |

* cited by examiner

Primary Examiner—Minh-Loan Tran
(74) Attorney, Agent, or Firm—Blakely, Sokoloff, Taylor & Zafman LLP

(57) ABSTRACT

In general, the embodiments introduce a pre-charge state between an idle state (when no data in being transmitted) and an active state (when data is being transmitted). In the pre-charge state, both differential signals are pre-charged to the common mode voltage, which is also the crossover voltage. Similarly, an additional pre-charge state is inserted between the active state and the idle state when the signals transition from active to idle. Because both signals for each bit, including the first and last bits, are being driven from the same voltage level, the quality of the first and last bits are improved to be similar in quality to the middle bits.

9 Claims, 3 Drawing Sheets

Predriver 280

HIGH SPEED DIFFERENTIAL PRE-DRIVER USING COMMON MODE PRE-CHARGE

FIELD OF THE INVENTION

The present invention pertains to the field of semiconductor devices. More particularly, this invention pertains to the field of high speed differential drivers and pre-drivers.

BACKGROUND OF THE INVENTION

In an effort to reduce costs and improve performance in today's computer systems, high speed serial differential interfaces are gradually replacing high pin count parallel interfaces to provide communication between computer system components. Bit rates on these interfaces are increasing, and as the bit rates increase, jitter margins decrease accordingly.

High-speed differential transmitters can improve transmitted signal quality by maintaining a consistent crossover point in the bit stream including the first bit and the last bit. The transmitter's jitter can be reduced if the placement of the crossover point is consistent. Typically, the first bit is driven from the ground state while subsequent bits cross over at the common mode voltage. This increases the width of the first bit because of the different crossover point. The width of the last bit is also increased because only one of the differential signals is driven to the ground state. Jitter margin is further decreased with the presence of process skew variations and variations in operating voltages and temperature.

Prior techniques for improving the quality of the first and last bits involve the use of pre-emphasis and selectively boosting the edge rate of the first and/or last bit in order to shorten the rise time. However, with these techniques, the signals are still driven from the ground state, which inherently gives the first and last bits an asymmetry that is not present on the other bits.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

In general, the embodiments below introduce a pre-charge state between an idle state (when no data is being transmitted) and an active state (when data is being transmitted). In the pre-charge state, both differential signals are pre-charged to the common mode voltage, which is also the crossover voltage. Similarly, an additional pre-charge state is inserted between the active state and the idle state when the signals transition from active to idle. Because both signals for each bit, including the first and last bits, are being driven from the same voltage level, the quality of the first and last bits are improved to be similar in quality to the middle bits. Jitter margins are improved and edge rate enhancement is not necessary.

Figure 1:
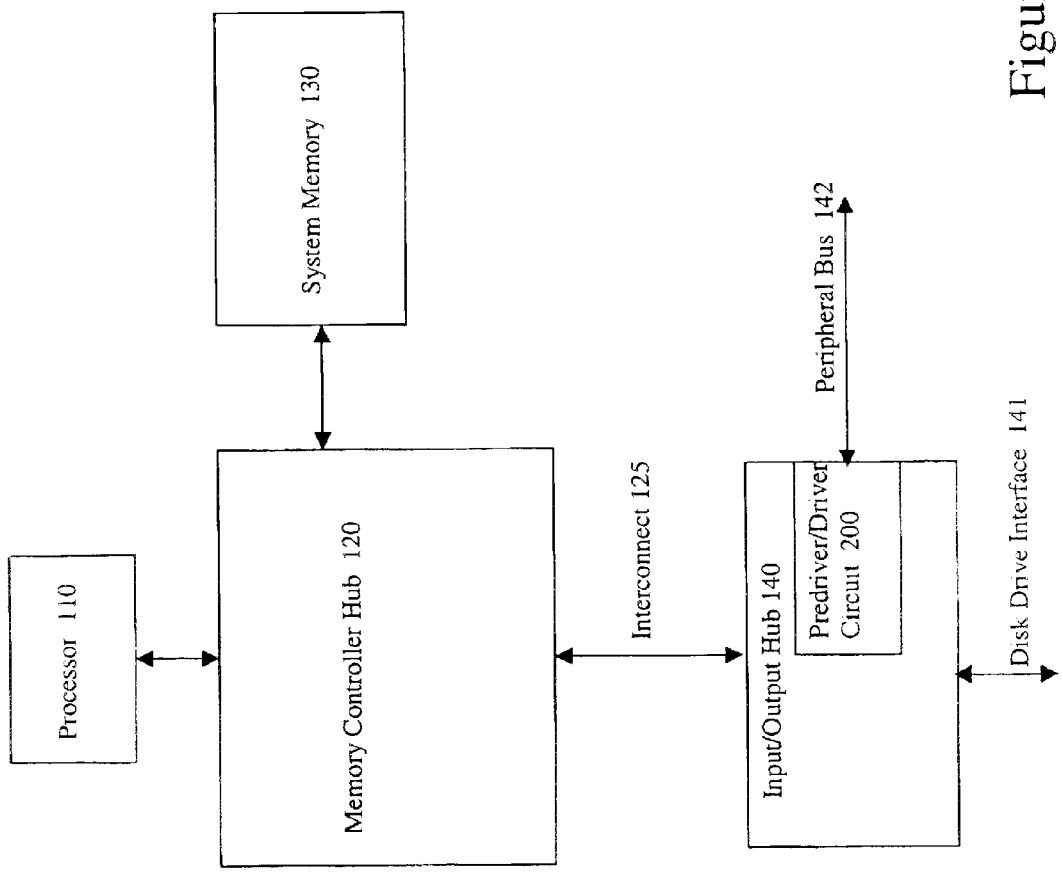
FIG. 1 is a block diagram of a computer system including a memory controller hub coupled to an input/output hub via an interconnect.

FIG. 1 is a block diagram of a computer system 100 that includes a processor 110 coupled to a memory controller hub 120. The memory controller hub 120 is coupled to a system memory 130. The memory controller hub 120 is further coupled to an input/output hub 140 via an interconnect 125. The input/output hub 140 provides interfaces to a peripheral bus 142 and a disk drive interface 141. The input/output hub 140 includes a predriver/driver circuit 200. The predriver/driver circuit 200 provides a serial differential output that is transmitted over the peripheral bus 142 to any of a wide variety of peripheral devices.

The predriver/driver circuit 200 will be discussed in detail below. Although FIG. 1 shows a specific computer system arrangement, the predriver/driver circuit 200 may be used in a wide variety of computer system configurations. Further, the predriver/driver circuit 200 may be used in any electronic device that transfers digital data over a differential interconnect. Also, although the embodiments described herein discuss a predriver/driver circuit for use with a serial interconnect, other embodiments are possible using parallel interconnects.

Figure 2:
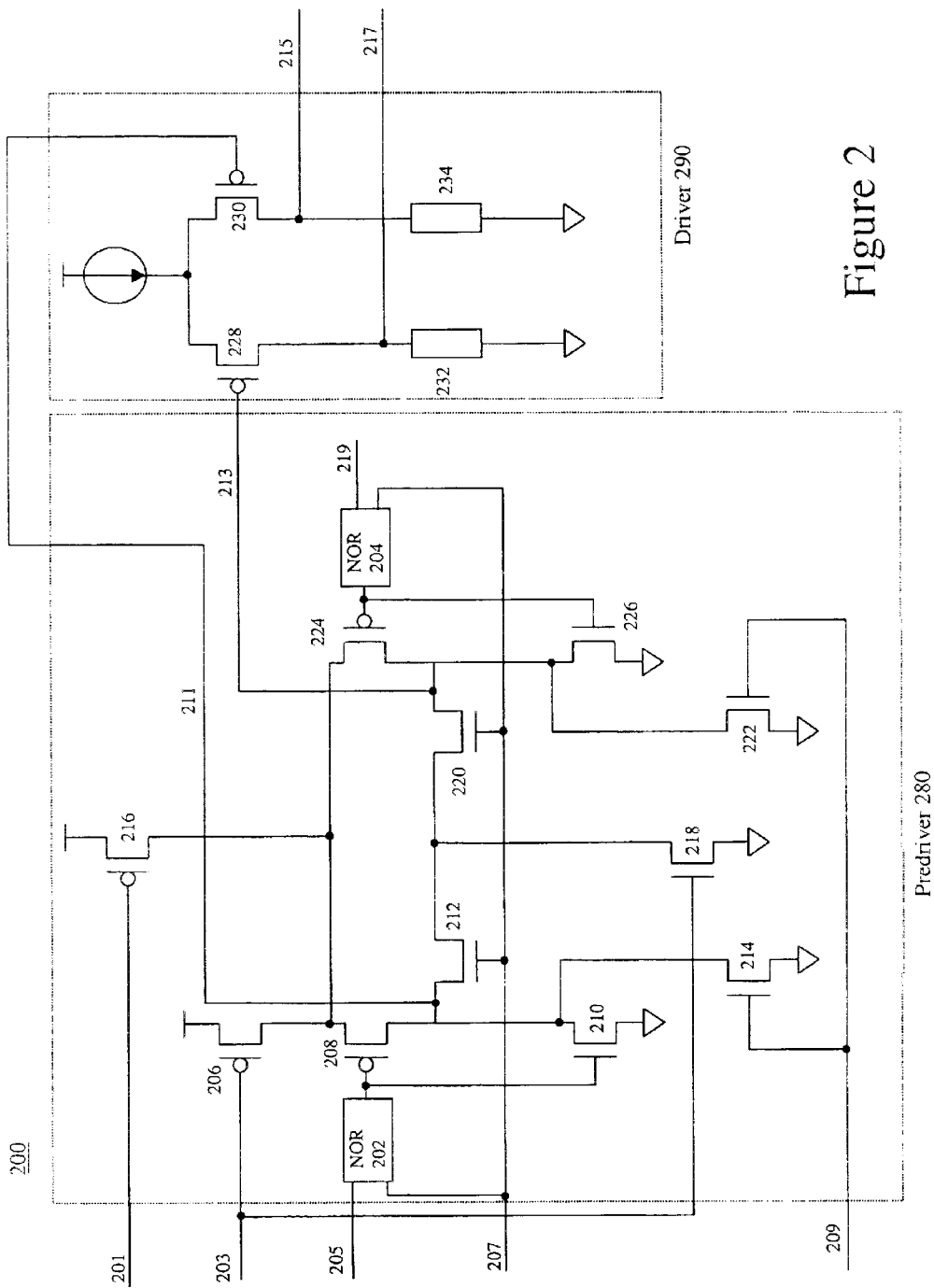
FIG. 2 is a schematic diagram of a driver coupled to a pre-driver that uses common mode pre-charge.

FIG. 2 is a schematic diagram of one embodiment of a predriver/driver circuit 200 including a predriver 280 and a driver 290. The output of the predriver 280 drives a switch including output transistors 228 and 230 which steer current to either or both of data outputs 215 and 217.

Figure 3:
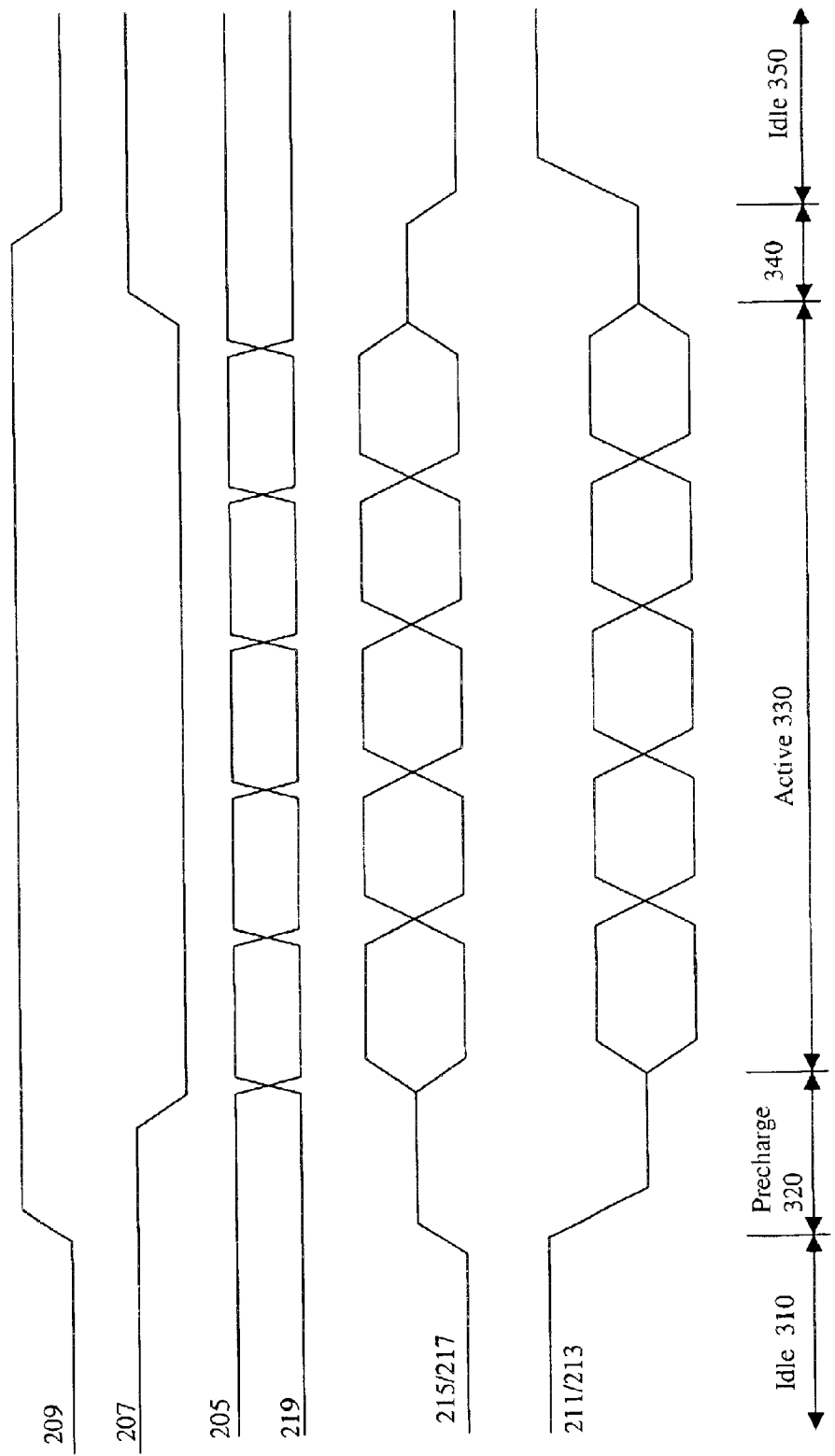
FIG. 3 is a timing diagram illustrating the operation of the driver and pre-driver of FIG. 2.

FIG. 3 is a timing diagram for the predriver 280 and the driver 290 as they change state from an idle state 310, to a pre-charge state 320, and to an active state 330, and then from the active state 330 to an additional pre-charge state 340 and to an idle state 350. The operation of the predriver 280 and driver 290 circuits can be best understood by examining FIG. 2 in conjunction with FIG. 3.

Under normal operating conditions, the signal 201 is pulled low to enable current flow through transistor 216. Signal 203 is pulled high in order to turn on transistor 218 and to turn of transistor 206.

In the idle state 310, signal 207 is pulled high and signal 209 is pulled low. This combination turns on transistors 208 and 224. Transistors 212 and 220 are also turned on in order to create a leakage path between signal 211 and 213 to transistor 218. Transistor 218 is a leaker device. The leakage path between signal 211 and 213 to transistor 218 will pull the signals 211 and 213 down a bit to shorten subsequent switching time, but the potential on signals 211 and 213 is not low enough to cause leakage in the output transistors 228 and 230.

During the pre-charge state 320, signal 209 is pulled high, transistors 214 and 222 are turned on and another leakage path is created for signals 211 and 213. The potential of signals 211 and 213 is thus pulled low enough to switch on both current steering output transistors 228 and 230 in the driver circuit 290. Because both signal 211 and signal 213 are at the same potential, an equal amount of current is steered across the load resistors 232 and 234 to the output pins 215 and 217. This results in equal potential on both differential signals. The differential signals are now pre-charged to the common mode or crossover voltage.

In the active state 330, signal 207 is pulled low. Transistors 212 and 220 are turned off, but transistors 214 and 222 are still on. Data input signals 205 and 219 are inverted by a NOR gate 202 and a NOR gate 204, respectively. The NOR gate 202 drives transistor 208 and the NOR gate 204 drives transistor 224. The signals 211 and 213 will switch according to the data pattern of the data input signals 205 and 219. The output signals 215 and 217 are also switched according to the data pattern of the data input signals 205 and 219.

After driving the last bit during the active state 330, the signal 207 is pulled high so that the predriver 280 and driver 290 return to the pre-charge state 340. Again, both differential output signals are driven to the common mode voltage, which is also the cross-over point. When the signal 209 is pulled low, the predriver 280 is back to the idle state 350. The signals 211 and 213 are pulled high and the current mode output transistors 228 and 230 in the output driver 290 are completely turned off.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than in a restrictive sense.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

What is claimed is:

1. Amended) An apparatus, comprising:

a first output transistor to steer current to a first output pin when a logically low potential is applied to a first output transistor gate;

a second output transistor to steer current to a second output pin when an appropriate potential is applied to a second output transistor gate; and a pre-driver circuit to apply approximately identical potentials to the first output transistor gate and the second transistor gate to enable the first and second output transistors to steer approximately the same amount of current to the first and second output pins, respectively, when the pre-driver circuit is in a pre-charge state.

2. The apparatus of claim 1, the second output transistor to steer current to the second output pin when a logically low potential is applied to the first output transistor gate.

3. The apparatus of claim 2, the application of the logically low potentials to the first and second output transistor gates to occur in response to the pre-driver circuit entering the precharge state.

4. The apparatus of claim 3, the recharge state following an idle state.

5. The apparatus of claim 4, the pre-driver circuit to deliver a logically high potential to the first output transistor gate during the idle state.

6. The apparatus of claim 5, the pre-driver circuit to deliver a logically high potential to the second output transistor gate during the idle state.

7. The apparatus of claim 6, the precharge state preceding an active state.

8. The apparatus of claim 7, pre-driver circuit to deliver a logically low potential to only one of the first and second output transistor gates at a time during the active state.

9. The apparatus of claim 8, an additional precharge state immediately following the active state.

* * * * *

UNITED STATES PATENT AND TRADEMARK OFFICE
CERTIFICATE OF CORRECTION

PATENT NO. : 6,819,145 B2
DATED : November 16, 2004
INVENTOR(S) : Swartz et al.

It is certified that error appears in the above-identified patent and that said Letters Patent is hereby corrected as shown below:

Column 3,
Line 31, delete "Amended)".

Column 4,
Line 19, delete "recharge" and insert -- precharge --.

Signed and Sealed this

Twenty-fourth Day of May, 2005

JON W. DUDAS
*Director of the United States Patent and Trademark Office*